United States Patent
Lin et al.

(10) Patent No.: US 9,472,600 B2
(45) Date of Patent: Oct. 18, 2016

(54) AMOLED DISPLAY DEVICES AND METHODS FOR PRODUCING THE SUB-PIXEL STRUCTURE THEREOF

(71) Applicant: EverDisplay Optronics (Shanghai) Limited, Shanghai (CN)

(72) Inventors: Hsin Chih Lin, Shanghai (CN); Chung Che Tsou, Shanghai (CN); Bin Zhang, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 14/737,836

(22) Filed: Jun. 12, 2015

(65) Prior Publication Data

US 2015/0364525 A1    Dec. 17, 2015

(30) Foreign Application Priority Data

Jun. 12, 2014   (CN) .......................... 2014 1 0261108

(51) Int. Cl.
  *H01L 27/32* (2006.01)
  *H01L 51/52* (2006.01)

(52) U.S. Cl.
  CPC ....... *H01L 27/3213* (2013.01); *H01L 27/3218* (2013.01); *H01L 51/5265* (2013.01); *H01L 2251/558* (2013.01)

(58) Field of Classification Search
  None
  See application file for complete search history.

(56) References Cited

U.S. PATENT DOCUMENTS

| | | | | |
|---|---|---|---|---|
| 2010/0053043 A1* | 3/2010 | Sakamoto | ........... | H01L 27/3213 345/77 |
| 2010/0244069 A1* | 9/2010 | Weaver | ................ | G09G 3/3208 257/98 |
| 2012/0105517 A1 | 5/2012 | Yang et al. | | |
| 2012/0287168 A1* | 11/2012 | Botzas | ................ | G09G 3/3413 345/690 |
| 2013/0146853 A1* | 6/2013 | Lee | ...................... | H01L 27/3216 257/40 |
| 2014/0061595 A1* | 3/2014 | Kim | .................... | H01L 27/3244 257/40 |

FOREIGN PATENT DOCUMENTS

| | | |
|---|---|---|
| CN | 1667455 | 9/2005 |
| CN | 101262725 | 9/2008 |

OTHER PUBLICATIONS

So, Woo-Young, et. al., "43.3: Power Efficient AMOLED Display with Novel Four Sub-Pixel Architecture and Driving Scheme." SID Symposium Digest SID Symposium Digest of Technical Papers 41.1 (2010): 622.*

* cited by examiner

*Primary Examiner* — Joseph Schoenholtz
(74) *Attorney, Agent, or Firm* — Andrew F. Young, Esq.; Lackenbach Siegel, LLP

(57) ABSTRACT

One embodiment of the present invention discloses an AMOLED display device and a method for producing the sub-pixels thereof. To change the metal masks used for forming the resonator adjustment layer in sub-pixels to form the sub-pixels with resonator adjustment layers in different thicknesses. On other hands, a light blue sub-pixel and an orange sub-pixel are added into a pixel unit to form the pixel unit consisting of a blue sub-pixel, a red sub-pixel, a green sub-pixel, a light blue sub-pixel and an orange sub-pixel. The AMOLED with the above features can reduce the power consumption in the display screen greatly, and can maintain the high color saturation.

8 Claims, 5 Drawing Sheets

AMOLED DISPLAY DEVICES AND METHODS FOR PRODUCING THE SUB-PIXEL STRUCTURE THEREOF

CROSS-REFERENCE TO RELATED APPLICATIONS

The present application claims priority to and the benefit of Chinese Patent Application No. CN 201410261108.6, filed on Jun. 12, 2014, the entire content of which is incorporated herein by reference.

BACKGROUND OF THE INVENTION

1. Field of the Invention

The present disclosure relates to organic light-emitting devices, more specifically, to AMOLED display devices and methods for producing the sub-pixel structure thereof.

2. Description of the Related Art

Currently, the trends require display to have low consumption and high color saturation. Active Matrix/Organic Light Emitting Diode ("AMOLED", hereinafter) Panels is one of the projects in research and development of display panels because of its ability of self-luminous in backlight and its high color saturation.

There are three types of OLED devices in each AMOLED display panel, and the OLED devices of each type emit lights whose color is different from that of any of the other two types. The OLED devices emitting green lights have the features of highest luminous efficiency and high color purity. However, if an OLED device emits red lights with high color purity, the luminous efficiency of the device will sharp decrease. Similarly, if an OLED device emits blue lights with high color purity, the luminous efficiency of the device will sharp decrease as well. However, compared with blue OLED devices, light blue OLED devices have higher luminous efficiencies, similarly, compared with red OLED devices, orange OLED devices have higher luminous efficiencies. Hence, in traditional arrangement for RGB pixels, it is effectively to reduce the power consumption in display screen with the help of the light blue OLED devices and orange OLED devices which are efficient in light emitting. Therefore, the power consumption in display screens can be reduced effectively and the high color saturation of AMOLED display screen can be maintained as well.

SUMMARY OF THE INVENTION

An aspect of an embodiment of the present disclosure is directed toward an AMOLED display device capable of reducing the power consumption greatly due to the addition of light blue sub-pixels and orange sub-pixels.

Another aspect of an embodiment of the present disclosure is directed toward a method for producing the sub-pixels of an AMOLED display device.

An AMOLED display device, comprising:

a pixel array consisting of a plurality of pixel units, each of the pixel units consisting of four sub-pixels, each of the pixel units emitting lights by adjusting its sub-pixels;

wherein, each sub-pixel comprises a resonator adjustment layer, and the resonator adjustment layer in any one of the sub-pixels is different in thickness from the resonator adjustment layer in other sub-pixels.

According to one embodiment of the present disclosure, wherein each of the sub-pixels comprise a combination of blue sub-pixels, red sub-pixels, green sub-pixels, light blue sub-pixels and orange sub-pixels.

According to one embodiment of the present disclosure, wherein the blue sub-pixels, the red sub-pixels, the green sub-pixels, the light blue sub-pixels and the orange sub-pixels are arranged in a PenTile way to form the pixel array.

According to one embodiment of the present disclosure, wherein in a pixel unit, the green sub-pixel is located centrally; the blue sub-pixel, the red sub-pixel, the light blue sub-pixel and the orange sub-pixel are arranged around the green sub-pixel.

According to one embodiment of the present disclosure, wherein the blue sub-pixel, the red sub-pixel, the light blue sub-pixel and the orange sub-pixel are shared by at least two of the pixel units.

According to one embodiment of the present disclosure, wherein the resonator adjustment layer in the orange sub-pixel is 160 nm to 170 nm in thickness; and the resonator adjustment layer in the light blue sub-pixel is 100 nm to 110 nm in thickness.

According to one embodiment of the present disclosure, wherein the resonator adjustment layer in the blue sub-pixel is 80 nm to 90 nm in thickness; and the resonator adjustment layer in the red sub-pixel is 180 nm to 190 nm in thickness.

A method for producing sub-pixels of an AMOLED device, comprising:

providing a substrate with a reflecting anode and a hole injection layer thereon;

forming a resonator adjustment layer on the hole injection layer; and forming a hole transport layer, a luminescent layer, an electron transfer layer, an electron injection layer and a semi-transparent cathode on the resonator adjustment layer in sequence to form a blue sub-pixel, a red sub-pixel, a green sub-pixel, a light blue sub-pixel or an orange sub-pixel;

wherein, the resonator adjustment layer in the orange sub-pixel is thinner than that in the red sub-pixel; the resonator adjustment layer in the light blue sub-pixel is thicker than that in the blue sub-pixel.

According to another embodiment of the present disclosure, wherein the luminescent layer is selected from a group consisting of a blue luminescent layer, a red luminescent layer and a green luminescent layer.

According to another embodiment of the present disclosure, wherein the luminescent layer in the light blue sub-pixel is a blue luminescent layer; and the resonator adjustment layer in the light blue sub-pixel is 100 nm to 110 nm in thickness;

the luminescent layer in the blue sub-pixel is a blue luminescent layer; and the resonator adjustment layer in the blue sub-pixel is 80 nm to 90 nm in thickness.

According to another embodiment of the present disclosure, wherein the luminescent layer in the orange sub-pixel is a red luminescent layer; and the resonator adjustment layer in the orange sub-pixel is 160 nm to 170 nm in thickness;

the luminescent layer in the red sub-pixel is a red luminescent layer; and the resonator adjustment layer in the red sub-pixel is 180 nm to 190 nm in thickness.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
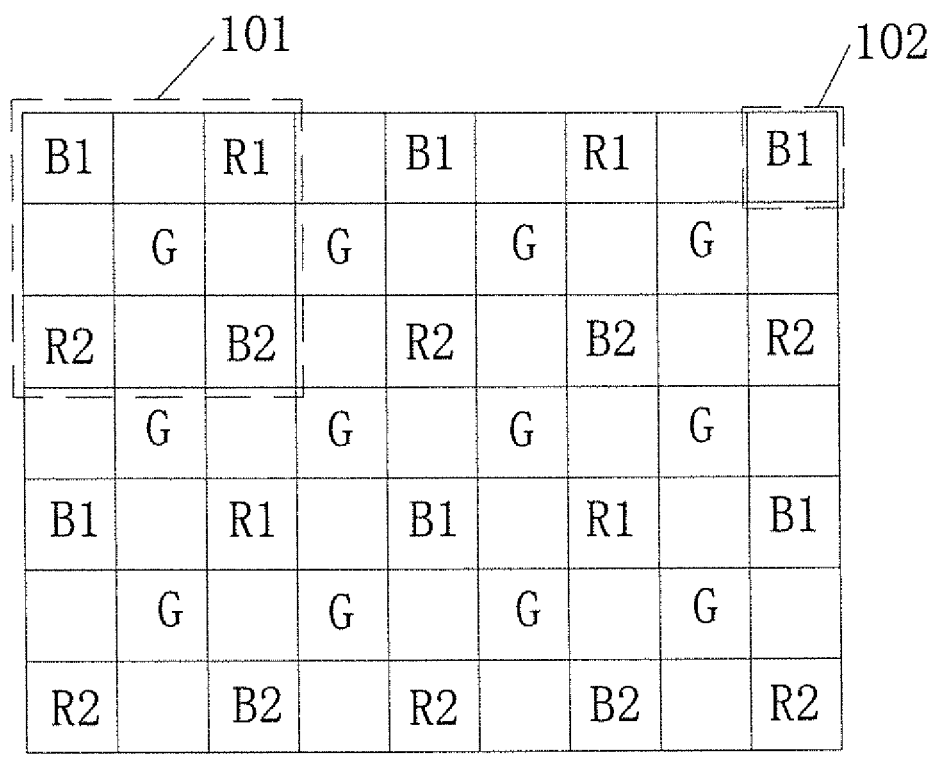
FIG. 1 shows a structure schematic of an AMOLED display device according to an embodiment in the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

According to the present invention, an AMOLED display device is provided. The AMOLED display device comprises a pixel array consisting of a plurality of pixel units. Each of the pixel units comprises at least four sub-pixels.

Embodiment 1

FIG. 1 shows a structure schematic of an AMOLED display device according to an embodiment in the present invention, as shown in FIG. 1, the present embodiment discloses an AMOLED display device. The display device comprises a pixel array consisting of a plurality of Pixel Units 101. Each of Pixel Units 101 consists of five sub-pixels including Blue Sub-Pixel B1, Red Sub-Pixel R1, Green Sub-Pixel G, Light Blue Sub-Pixel B2 and Orange Sub-Pixel R2. Pixel Unit 101 will emit lights by adjusting the five Sub-Pixels. The thickness of the resonator adjustment layer in each sub-pixel is different from that of others. Preferably, the thickness of the resonator adjustment layer in the orange sub-pixel is 160~170 nm, such as 160 nm, 162 nm, 164 nm, 166 nm and 168 nm; the thickness of the resonator adjustment layer in the light blue sub-pixel is 100~110 nm, such as 100 nm, 102 nm, 104 nm, 106 nm and 108 nm; the thickness of the resonator adjustment layer in the blue sub-pixel is 80~90 nm, such as 81 nm, 82 nm, 84 nm, 87 nm, 89 nm; the thickness of the resonator adjustment layer in the red sub-pixel is 180~190 nm, such as 181 nm, 182 nm, 184 nm, 187 nm and 189 nm.

Figure 2:
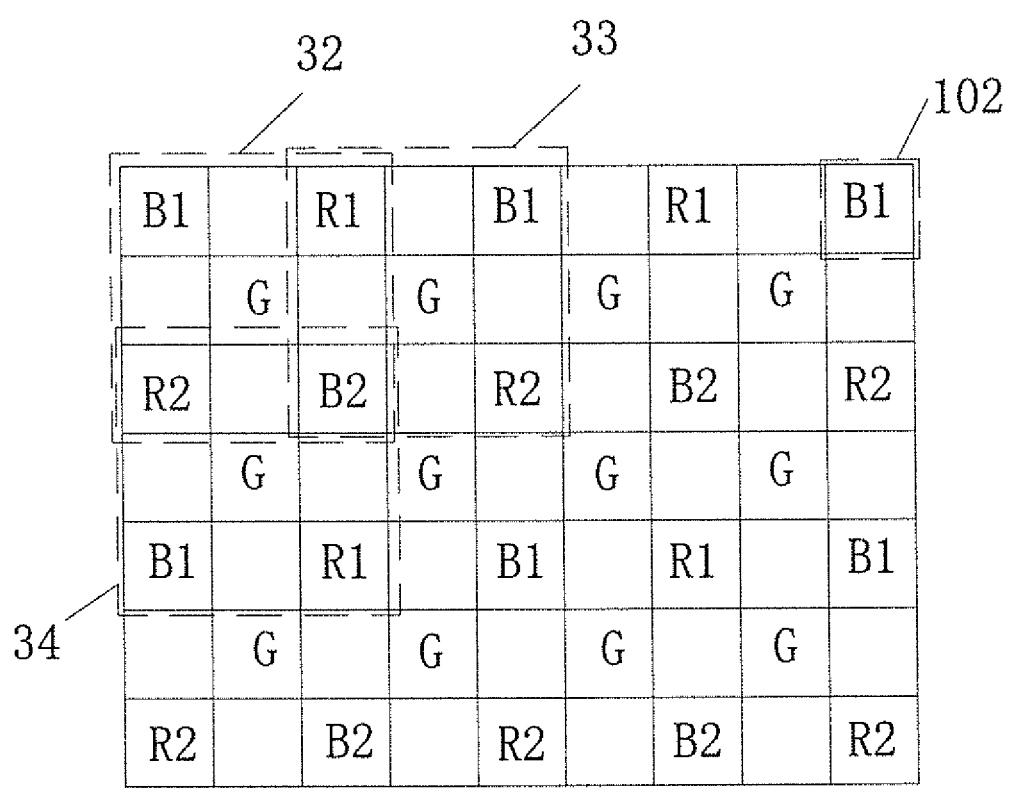
FIG. 2 shows a structure schematic of shared pixels according to Embodiment 1 in the present invention.
Figure 3:
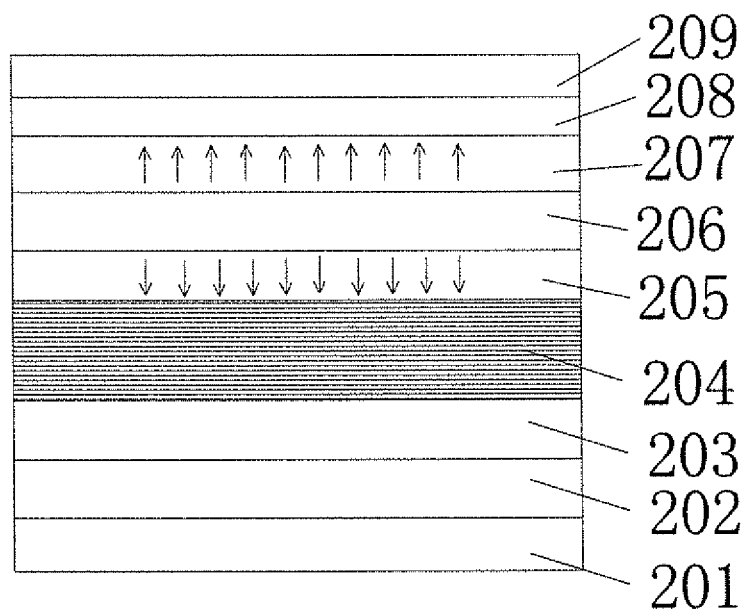
FIG. 3 shows a structure schematic of sub-pixels according to Embodiment 2 in the present invention.

FIG. 2 shows a structure schematic of shared pixels according to Embodiment 1 in the present invention, as shown in FIG. 2, Blue Sub-Pixel B1, Red Sub-Pixel R1, Green Sub-Pixel G, Light Blue Sub-Pixel B2 and Orange Sub-Pixel R2 are arranged as tile matrix to form a pixel array. In each pixel unit, Green Sub-Pixel G is in the center; Blue Sub-Pixel B1, Red Sub-Pixel R1, Light Blue Sub-Pixel B2 and Orange Sub-Pixel R2 are arranged around Green Sub-Pixel G Each of Pixel Units 101 is formed by a Green Sub-Pixel G and the shared sub-pixels including a Blue Sub-Pixel B1, a Red Sub-Pixel R1, a Light Blue Sub-Pixel B2 and an Orange Sub-Pixel R2.

Preferably, the present embodiment discloses an AMOLED display device comprising a plurality of pixel units. Referring to Pixel Unit 32 and Pixel Unit 33, Pixel Unit 32 has a structure as nine block box and is provided with five sub-pixels including a Blue Sub-Pixel B1, a Red Sub-Pixel R1, a Green Sub-Pixel G, a Light Blue Sub-Pixel B2 and an Orange Sub-Pixel R2. Green Sub-Pixel G is rectangle in shape and located in the center of each pixel unit. The four rectangle blocks whose one edge overlaps the corresponding edge of Green Sub-Pixel G are the sub-pixels which will not emit lights. The sub-pixels which will not emit lights and the sub-pixels which emit lights are arranged at intervals.

The two sub-pixels at the ends of each diagonal line in a pixel unit are a Blue Sub-Pixel B1 and a Light Blue Sub-Pixel B2 or a Red Sub-Pixel R1 and an Orange Sub-Pixel R2. In the present invention, at the upper left corner of Pixel Unit 32 there is a Blue Sub-Pixel B1; at the lower right corner of Pixel Unit 32 there is a Light Blue Sub-Pixel B2; at the upper right corner of Pixel Unit 32 there is a Red Sub-Pixel R1; at the lower left corner of Pixel Unit 32 there is an Orange Sub-Pixel R2.

Two adjacent pixel units share two sub-pixels. Specifically, Pixel Unit 32 and Pixel Unit 33 are adjacent to each other on the right or left; Red Sub-Pixel R1 and Light Blue Sub-Pixel B2 are shared by Pixel Unit 32 and Pixel Unit 33. Pixel Unit 32 and Pixel Unit 34 are adjacent to each other on the top or below; Orange Sub-Pixel R2 and Light Blue Sub-Pixel B2 are shared by Pixel Unit 32 and Pixel Unit 34. Other conditions of shared Sub-Pixels are not illustrated here one by one.

Light Blue Sub-Pixel B2 and Orange Sub-Pixel R2 are added into the traditional RGB pixel arrangement in the present embodiment. The luminous efficiency of Light Blue Sub-Pixel B2 is higher than that of Blue Sub-Pixel B1 and the luminous efficiency of Orange Sub-Pixel R2 is higher than that of Red Sub-Pixel R1. However, Green Sub-Pixel G has the highest reflective efficiency and high color purity. Light Blue Sub-Pixel B2 assists Blue Sub-Pixel B1 to emit lights, and Orange Sub-Pixel R2 assists Red Sub-Pixel R1 to emit lights. Compared with the traditional RGB pixel arrangement using Green Sub-Pixels G, Red Sub-Pixels R and Blue Sub-Pixels B, the color area generated by the pixel arrangement according to the embodiment of the present invention is reduced just by 15%. The quantity of the sub-pixels with high color purity is reduced in use, so the power consumption in display screen is reduced greatly.

Embodiment 2

The present invention provides a method for producing the sub-pixel structure based on Embodiment 1, comprising the following steps: providing a Substrate 201 with a Reflecting Anode 202 and a Hole Injection Layer 203; forming a Resonator Adjustment Layer 204 at the upper surface of Hole Injection Layer 203; forming a Hole Transport Layer 205, Luminescent Layer 206, Electron Transfer Layer 207, Electron Injection Layer 208 and Semi-Transparent Cathode 209 respectively on the Resonator Adjustment Layer 204, and then forming blue sub-pixel structure, red sub-pixel structure, green sub-pixel structure, light blue sub-pixel structure and orange sub-pixel structure. The resonator adjustment layer in the orange sub-pixel structure is thinner than that in the red sub-pixel structure, and the resonator adjustment layer in the light blue sub-pixel structure is thicker than that in the blue sub-pixel structure.

Reflecting Anode 202 is made of metal with high reflectance, a preferred selection of the metal is silver or aluminum. Preferably, Semi-Transparent Cathode 209 is formed by metal with half penetration and half reflection, a preferred selection of the metal is magnesium or silver or silver-magnesium alloys.

Specifically, Luminescent Layer 206 is a blue light-emitting layer, a red light-emitting layer or a green light-emitting layer. The light blue sub-pixel structure is formed when the luminescent layer is a blue light-emitting layer whose resonator adjustment layer is 100~110 nm in thickness, such as 101 nm, 103 nm, 103 nm, 107 nm and 109 nm. The blue sub-pixel structure is formed when the luminescent layer is a blue light-emitting layer whose resonator adjustment layer is 80~90 nm in thickness, such as 80 nm, 81 nm, 83 nm, 86 nm and 90 nm. The orange sub-pixel structure is formed when the luminescent layer is a red light-emitting layer whose resonator adjustment layer is 160~170 nm in thickness, such as 161 nm, 163 nm, 165 nm, 167 nm, 169 nm. The red sub-pixel structure is formed when the luminescent layer is a red light-emitting layer whose resonator adjustment layer is 180~190 nm in thickness, such as 182 nm, 184 nm, 185 nm, 188 nm and 190 nm.

The sub-pixel structure emits light blue light when the luminescent layer emits blue light, in the meantime, the resonator adjustment layer is 100~110 nm in thickness, such as 102 nm, 103 nm, 104 nm, 107 nm and 110 nm. The sub-pixel structure emits orange light when the luminescent layer emits red light, in the meantime, the resonator adjustment layer is 160~170 nm in thickness, such as 160 nm, 163 nm, 165 nm, 167 nm and 170 nm. When the luminescent layer in the red sub-pixel structure emits red light, the resonator adjustment layer is 180~190 nm in thickness, such as 183 nm, 184 nm, 185 nm, 187 nm and 199 nm. When the luminescent layer in the blue sub-pixel structure emits blue light, the resonator adjustment layer is 80~90 nm in thickness, such as 80 nm, 81 nm, 85 nm, 86 nm and 88 nm.

Based on the above technical solution, preferably, evaporation areas in Resonator Adjustment Layer 204 is defined by using metal masks and evaporating organic materials, therefore, the sub-pixels emitting different color lights have the resonator adjustment layers with different colors. Referring to the formula below.

$$\frac{2L}{\lambda} - \frac{\Phi}{2\pi} = m \quad (1)$$
$$(m = 1, 2, 3, 4 \ldots \text{integer})$$

$$L = \sum n_i l_i \quad (2)$$

$$\Phi = \Phi_1 + \Phi_2 \quad (3)$$

$$\Phi_1 = \tan^{-1} \frac{2n_a k_1}{n_a^2 - n_1^2 - k_1^2} \quad (4)$$

$$\Phi_2 = \tan^{-1} \frac{2n_b k_2}{n_b^2 - n_2^2 - k_2^2} \quad (5)$$

Wherein, L denotes the optical length of the space between Reflecting Anode 202 and Semi-Transparent Cathode 209; λ denotes resonant wavelength; $n_i$ denotes optical refractive index of various materials; $l_i$ denotes the thickness of various layers; φ denotes the total of the metal phase difference between Reflecting Anode 202 and Semi-Transparent Cathode 209; $\phi_1$ denotes the metal phase difference of Semi-Transparent Cathode 209; $\phi_2$ denotes the metal phase difference of Reflecting Anode 202; $n_a$ denotes the refractive index of the materials adjacent to Semi-Transparent Cathode 209; $n_1$ denotes the real part of the number representing the refractive index of Semi-Transparent Cathode 209; $K_1$ denotes the imaginary part of the number representing the refractive index of Semi-Transparent Cathode 209; $n_b$ denotes the refractive index of Resonator Adjustment Layer 204; $n_2$ denotes the real part of the number representing the refractive index of Reflecting Anode 202; $K_2$ denotes the imaginary part of the number representing the refractive index of Reflecting Anode 202.

When $n_a$, $n_s$, $n_1$, $n_2$, $k_1$, $k_2$ is known constants, L denotes the total of the optical lengths of Hole Injection Layer 203, Resonator Adjustment Layer 204, Hole Transport Layer 205, Luminescent Layer 206, Electron Transfer Layer 207 and Electron Injection Layer 208. Hence, when the wavelength (λ) of the light is selected, the optical length of Resonator Adjustment Layer 204 in each type of the pixel units can be worked out according to the above formulas. When the refractive index of the selected Resonator Adjustment Layer 204 is known, the optimum thickness of Resonator Adjustment Layer 204 can be worked out.

Figure 4:
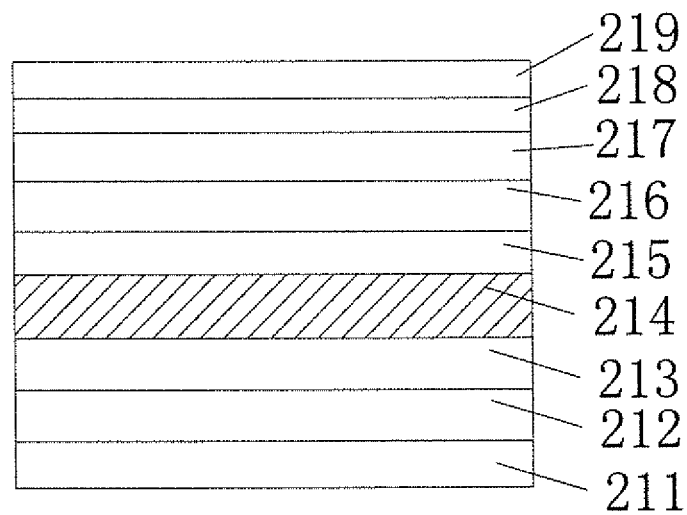
FIG. 4 shows a structure schematic of a light blue sub-pixel according to Embodiment 2 in the present invention.
Figure 5:
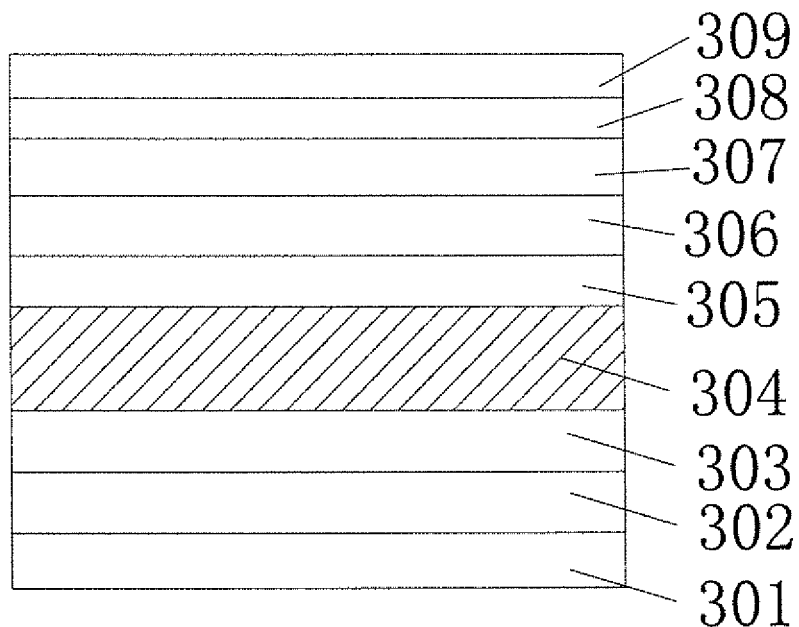
FIG. 5 shows a structure schematic of a blue sub-pixel according to Embodiment 2 in the present invention.

FIG. 4 shows a structure schematic of a light blue sub-pixel according to Embodiment 2 in the present invention; FIG. 5 shows a structure schematic of a blue sub-pixel according to Embodiment 2 in the present invention; as shown in FIGS. 4 to 5, the difference between the blue sub-pixel structure and the light blue sub-pixel structure is the thickness of the resonator adjustment layer. Therefore, in the producing process of light blue sub-pixel, the only difference from that of blue sub-pixel is to change the metal mask for the resonator adjustment layer and to perform the evaporation for forming the resonator adjustment layer just at some specified areas, the rest of processes are the same to that for producing the blue sub-pixel. Hence, the light blue sub-pixel and the blue sub-pixel can be produced simultaneously. Specifically, the Luminescent Layer 216 in the light blue sub-pixel and the Luminescent Layer 306 in the blue sub-pixel both emit blue lights, preferably, by using the above formulas, the thickness of Resonator Adjustment Layer 214 is 100~110 nm, such as 100 nm, 101 nm, 103 nm, 104 nm and 110 nm, and the thickness of Resonator Adjustment Layer 304 is 80~90 nm, such as 80 nm, 81 nm, 83 nm, 85 nm and 89 nm. Hence, the blue lights emitted from the luminescent layer will have different purity by passing through the resonator adjustment layers with different thickness.

Figure 6:
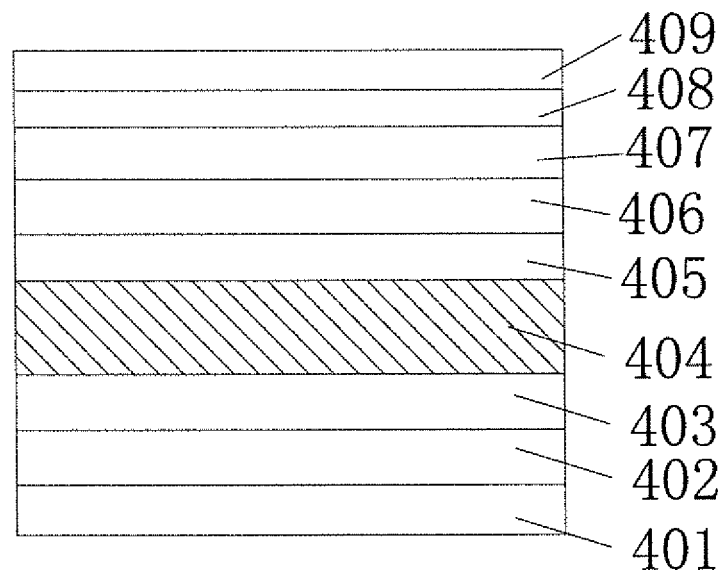
FIG. 6 shows a structure schematic of an orange sub-pixel according to Embodiment 2 in the present invention.
Figure 7:
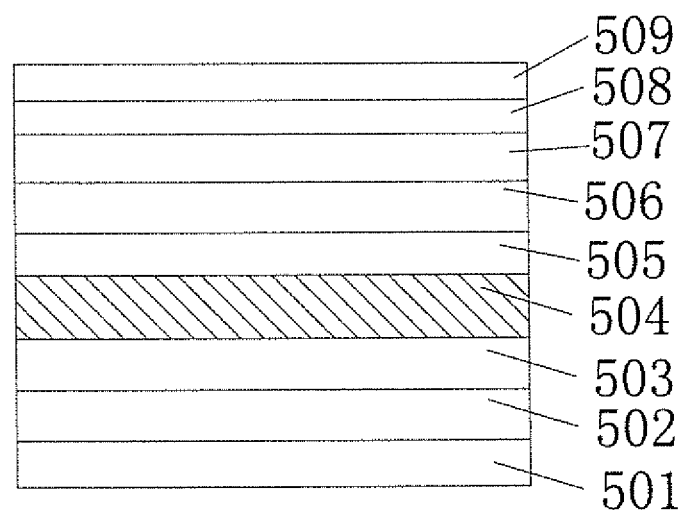
FIG. 7 shows a structure schematic of a red sub-pixel according to Embodiment 2 in the present invention.

FIG. 6 shows a structure schematic of an orange sub-pixel according to Embodiment 2 in the present invention; FIG. 7 shows a structure schematic of a red sub-pixel according to Embodiment 2 in the present invention. As shown in FIGS. 6 to 7, the difference between the red sub-pixel structure and the orange sub-pixel structure is the thickness of the resonator adjustment layer. Therefore, in the producing process of orange sub-pixel, the only difference from that of red sub-pixel is to change the metal mask for the resonator adjustment layer and to perform the evaporation for forming the resonator adjustment layer just at some specified areas, the rest of processes are the same to that for producing the red sub-pixel. Hence, the orange sub-pixel and the red sub-pixel can be produced simultaneously. Specifically, the Luminescent Layer 506 in the orange sub-pixel and the Luminescent Layer 406 in the red sub-pixel both emit blue lights, preferably, by using the above formulas, the thickness of Resonator Adjustment Layer 404 is 160~170 nm, such as 161 nm, 162 nm, 165 nm, 166 nm and 168 nm, and the thickness of Resonator Adjustment Layer 504 is 180~190 nm, such as 180 nm, 181 nm, 183 nm, 186 nm and 190 nm. Hence, the red lights emitted from the luminescent layer will have different purity by passing through the resonator adjustment layers with different thickness.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An AMOLED display device, comprising:
    a pixel array consisting of a plurality of pixel units, each of the pixel units consisting of a blue sub-pixel, a red sub-pixel, a green sub-pixel, a light blue sub-pixel and an orange sub-pixel, each of the pixel units emitting lights by adjusting its sub-pixels;
    wherein, each sub-pixel comprises a resonator adjustment layer, and the resonator adjustment layer in any one of the sub-pixels is different in thickness from the resonator adjustment layer in other sub-pixels;
    the blue sub-pixel, the red sub-pixel, the green sub-pixel, the light blue sub-pixel and the orange sub-pixel are arranged in a PenTile way to form in the pixel array;
    the green sub-pixel is located centrally; the blue sub-pixel, the red sub-pixel, the light blue sub-pixel and the orange sub-pixel are arranged around the green sub-pixel.

2. The AMOLED display device as claimed in claim 1, wherein the blue sub-pixel, the red sub-pixel, the light blue sub-pixel and the orange sub-pixel are shared by at least two of the pixel units.

3. The AMOLED display device as claimed in claim 1, wherein the resonator adjustment layer in the orange sub-pixel is 160 nm to 170 nm in thickness; and
    the resonator adjustment layer in the light blue sub-pixel is 100 nm to 110 nm in thickness.

4. The AMOLED display device as claimed in claim 1, wherein the resonator adjustment layer in the blue sub-pixel is 80 nm to 90 nm in thickness; and
    the resonator adjustment layer in the red sub-pixel is 180 nm to 190 nm in thickness.

5. A method for producing sub-pixels of an AMOLED device, comprising:
    providing a substrate with a reflecting anode and a hole injection layer thereon;
    forming a resonator adjustment layer on the hole injection layer; and
    forming a hole transport layer, a luminescent layer, an electron transfer layer, an electron injection layer and a semi-transparent cathode on the resonator adjustment layer in sequence to form a blue sub-pixel, a red sub-pixel, a green sub-pixel, a light blue sub-pixel or an orange sub-pixel; the green sub-pixel being located centrally: the blue sub-pixel, the red sub-pixel, the light blue sub-pixel and the orange sub-pixel being arranged around the green sub-pixel;
    wherein, the resonator adjustment layer in the orange sub-pixel is thinner than that in the red sub-pixel; the resonator adjustment layer in the light blue sub-pixel is thicker than that in the blue sub-pixel.

6. The method for producing sub-pixels as claimed in claim 5, wherein the luminescent layer is selected from a group consisting of a blue light luminescent layer, a red light luminescent layer and a green light luminescent layer.

7. The method for producing sub-pixels as claimed in claim 5, wherein the luminescent layer in the light blue sub-pixel is a blue light luminescent layer; and the resonator adjustment layer in the light blue sub-pixel is 100 nm to 110 nm in thickness;
    the luminescent layer in the blue sub-pixel is a blue light luminescent layer; and the resonator adjustment layer in the blue sub-pixel is 80 nm to 90 nm in thickness.

8. The method for producing sub-pixels as claimed in claim 5, wherein the luminescent layer in the orange sub-pixel is a red light luminescent layer; and the resonator adjustment layer in the orange sub-pixel is 160 nm to 170 nm in thickness;
    the luminescent layer in the red sub-pixel is a red light luminescent layer; and the resonator adjustment layer in the red sub-pixel is 180 nm to 190 nm in thickness.

* * * * *